United States Patent [19]

Hakamada

[11] Patent Number: 4,750,040
[45] Date of Patent: Jun. 7, 1988

[54] APPARATUS CONTROLLED BY A MICRO-COMPUTER AND INCLUDING POWER LOSS DATA CHECKING

[75] Inventor: Kunio Hakamada, Tokyo, Japan
[73] Assignee: Sony Corporation, Tokyo, Japan
[21] Appl. No.: 898,113
[22] Filed: Aug. 20, 1986
[30] Foreign Application Priority Data Aug. 23, 1985 [JP] Japan .................. 60-185353

[51] Int. Cl.⁴ .............................. H04N 5/44
[52] U.S. Cl. .................. 358/188; 358/190; 358/903; 455/185; 365/229
[58] Field of Search ............ 358/188, 190, 903; 455/185, 186, 343; 365/226, 228, 229

[56] References Cited
U.S. PATENT DOCUMENTS 4,281,349 7/1981 George .................. 358/191.1
4,545,068 10/1985 Tabata .................. 358/903

Primary Examiner—Tommy P. Chin
Attorney, Agent, or Firm—Lewis H. Eslinger

[57] ABSTRACT

Apparatus for use in a television receiver of the kind controlled by a micro-computer is intended for the situation in which power failures occur and specifically where instantaneous power failures occur and shortly thereafter the power is recovered, in which it is determined whether or not the time display data stored in a memory of the micro-computer is correct and, if so, such data is continued to be refreshed and is used for the time display, whereby a backup circuit is simplified in construction, and even eliminated in some cases. The main television receiver control data are stored in a nonvolatile memory when a power interruption occurs, but are only used to refresh the random access memory of the micro-computer in those instances where the power outage exists for a period of time long enough to erase the time display data retained in the random access memory, a condition that is determined by checking such time display data each time it is necessary to reset the central processing unit of the micro-computer in view of a drop in line voltage.

12 Claims, 3 Drawing Sheets

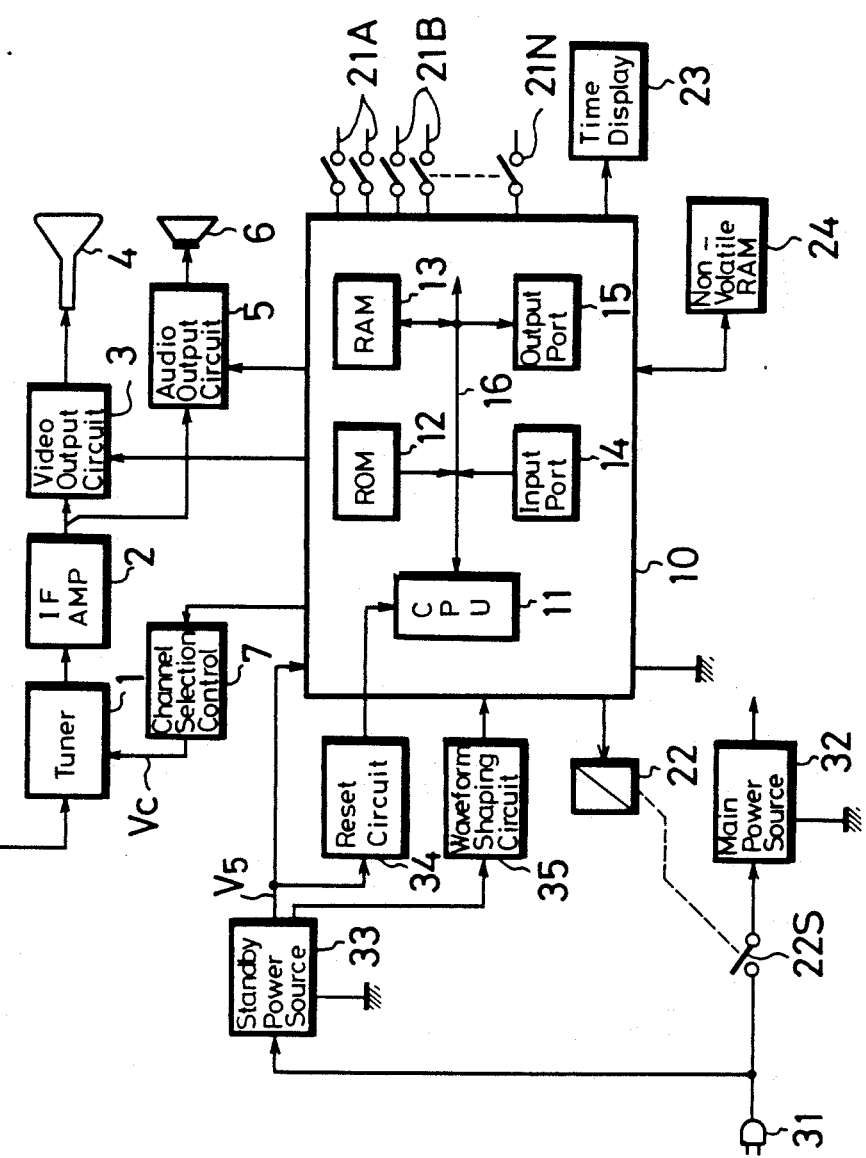

APPARATUS CONTROLLED BY A MICRO-COMPUTER AND INCLUDING POWER LOSS DATA CHECKING

BACKGROUND OF THE INVENTION

1. Field of the Invention

This invention relates generally to a television receiver controlled by a micro-computer and, more particularly, to an apparatus which is controlled by the micro-computer to provide backup data to the television receiver when a power failure occurs.

2. Description of the Prior Art

The alternating current power typically supplied to homes by public utility companies frequently encounters interruptions. In some instances, the power failures can last for an appreciable period of time, such as when they are caused by a storm or the like, however, in most cases such power failures are essentially instantaneous and are terminated within a second or less. Such power failures or brief outages may be caused by generator switch overs or network changes within the power grid, and brief power outages can also be caused in the home by rapid increases in load, such as when the motor of a refrigerator or air conditioner unit is suddenly switched on.

As modern television receivers become to rely more and more on digital data techniques and the associated storage of the data digital, to both tune the channel and to control picture quality and the like these power outages become quite serious, because all the operating data can be lost when the power goes down.

To accommodate these power outages, it has been proposed to provide some sort of backup, whereby the data used in a micro-computer, for example, to control the television receiver would not be lost upon the occurrence of a power outage. Generally, in a digitally controlled television receiver, a standby power source is provided to keep power on the micro-computer at all times, and this usually involves feeding a DC voltage derived from the AC line voltage to the micro-computer. Another approach to dealing with such power outages in a digitally controlled television receiver is to provide a nonvolatile memory connected to the micro-computer so that when the power source for the television is turned off, the channel selection data, sound volume data, and the like, which are typically stored in the random access memory portion of the micro-computer, may be transferred to the nonvolatile memory for storage. This data is stored therein even in the face of a power outage.

A reset circuit is also generally employed in cooperation with a standby power source so that when a power failure occurs, the central processing unit of the micro-computer is reset by the reset circuit.

Another feature of a digitally controlled television receiver typically involves time display and another problem occurs in displaying such time once a power failure occurs. Usually the timing data is stored in the random access memory and is refreshed or updated every minute and, thus, in the case of a power outage the appropriate clock data in the nonvolatile memory would have to be refreshed every minute. As is well known, however, such nonvolatile memories usually involve some sort of magnetic elements, such as a bubble memory, which can generally only be accessed about 100,000 times in its lifetime. This is perfectly adequate to accommodate the number of times a television receiver is turned on and off during its lifetime, which on the average is about seven years, however, if the nonvolatile memory were to be used for time display data storage the clock data would have to be rewritten every minute and the nonvolatile memory would quickly wear out. To accommodate this, it is typically known to back up the power source of the micro-computer by a special, large value condenser or a capacitor bank to prevent the time display data in the random access memory of the micro-computer from being erased when a power failure occurs.

Thus, the two known approaches to providing backup to a digital television receiver during a power outage involve an increase in the manufacturing cost of the television receiver.

OBJECTS AND SUMMARY OF THE INVENTION

Accordingly, it is an object of the present invention to provide an apparatus for use with a micro-computer controlled television receiver that can accommodate power failures and overcome the above-noted defects inherent in the prior art.

Another object of this invention is to provide a backup system for a micro-computer controlled television receiver so that even if a power failure continues for a long time, main television data is retained so that the television operation can resume when the power is returned.

A further object of this invention is to provide apparatus for use in a micro-computer controlled television receiver such that if a power backup source for the micro-computer is employed in the form of a condenser, the value of such backup condenser can be decreased.

A still further object of this invention is to provide apparatus for use in a micro-computer controlled television receiver, whereby the manufacturing cost of the television receiver can be reduced.

In accordance with an aspect of the present invention, apparatus is provided for use in a micro-computer controlled television in which a random access memory is provided as part of the micro-computer that has a data holding voltage that is lower than the operation voltage of the micro-computer. Also provided is a means to supply a DC voltage to the micro-computer, a means to reset the micro-computer when that DC voltage drops below the operation voltage of the micro-computer, and a system to check the timing display data in the random access memory to determine if that data is incorrect. If the timing data is correct the data stored in the random access memory of the micro-computer can be used once the power resumes but if the data is incorrect then the main data for controlling the television receiver that was stored in a nonvolatile memory is used to refresh the random access memory.

The above and other objects, features and advantages of the present invention will become apparent from the following detailed description of illustrated embodiments thereof to be read in conjunction with the accompanying drawings, in which like reference numerals designate like or similar elements and parts.

BRIEF DESCRIPTION OF THE DRAWINGS

FIG. 1 is a schematic in block diagram form of apparatus for use with a micro-computer controlled television receiver according to an embodiment of the present invention;

DESCRIPTION OF PREFERRED EMBODIMENTS

Figure 2A:
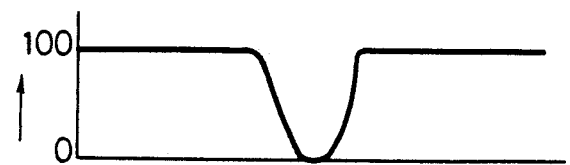
FIGS. 2A and 2B are useful in explaining the operation of the system of FIG. 1.

FIG. 1 schematically represents a portion of a micro-computer controlled television receiver and, more particularly, reference numerals 1 through 7 designate those circuits that form the main receiving system of a television receiver. The television signal is received at the antenna AN and is supplied to a tuner circuit 1, and the video intermediate frequency signal (IF) from tuner 1 is fed through an intermediate frequency (IF) amplifier 2 to a video output circuit 3, from which the three primary color signals are derived and fed to a color cathode ray tube 4 for display. In addition, the intermediate frequency signal from the IF amplifier 2 is also supplied to an audio output circuit 5, which derives the audio signal therefrom and feeds it to a loudspeaker 6. Tuning is typically achieved by means of a channel selection control circuit 7 that provides a tuning signal to tuner circuit 1 so that the appropriate channel selection is carried out.

The micro-computer typically found in this type of digital television receiver carries out the control operations, such as channel selection and the like, and one form that micro-computer 10 may take is that of a one-chip micro-computer with four-bit data processing. Generally, micro-computer 10 includes a central processing unit 11 (CPU), a read only memory 12 (ROM), in which the various kinds of control programs are written, and a random access memory 13 (RAM) used as a work area and a data area. A plurality of input ports 14 and output ports 15 typically found in micro-computers are also provided. As is well known, these circuit elements 12 through 15 making up micro-computer 10 are all connected to the central processing unit 11 by a common bus 16.

Of course, television receivers typically include a number of function selecting and operating keys, and such keys are represented at 21A through 21N and are connected to micro-computer 10 through input port 14. For example, tuning control to change the station by increasing or decreasing the channel number can be provided at keys 21A, and such channel selection data would be stored in random access memory 13 and supplied through output port 15 to control circuit 7, which provides a control voltage Vc that varies to tune the channel in tuner 1. Similarly, other control signals are derived in response to operation of keys 21B through 21N, with the appropriate control signals being supplied through the input ports 14 and output ports 15 to video output circuit 3 and audio output circuit 5 for changing volume, picture contrast, hue, color, and the like. A main power source circuit 32 is provided and one of keys 21A through 21N would be the main power key, so that when the power key is depressed a relay 22 will be driven by a signal produced at output port 15 and the relay contacts 22S will be closed. As a result of the operation of relay 22, a standard utility AC voltage from power source plug 31 is applied through relay contacts 22S to a main power source circuit 32 that produces a predetermined DC voltage used to operate the circuits of the television receiver. For example, the DC voltage generated by main power source circuit 32 would be supplied to all of the circuits 1 through 7 as the respective operating voltages thereof.

A standby power source circuit 33 is connected to the line voltage through plug 31 and provides a DC voltage V5 that may be, for example, 5 volts. This DC voltage V5 is always supplied to micro-computer 10 as the operation voltage thereof, even when the television has been turned off, in order to keep the necessary data in RAM 13. Reset circuit 34 receives DC voltage V5 as the input voltage thereto and if DC voltage V5 drops to a voltage less than the operational voltage of micro-computer 10, which may be, for example, 4 volts, reset circuit 34 will detect this voltage drop and supply an output signal to central processing unit 11 as a reset signal therefor. Accordingly, central processing unit 11 is kept reset by reset circuit 34 during a time period in which the AC line voltage drops to an unacceptable limit.

Figure 2B:
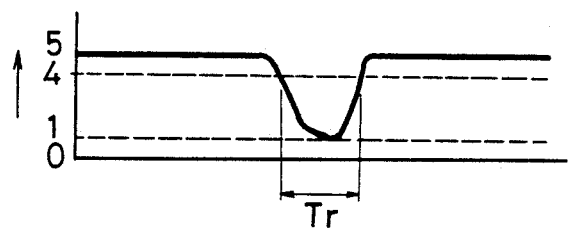

Referring to FIG. 2A, the AC line voltage is arbitrarily shown as 100 volts and a brief period is shown during which the line voltage drops to zero volts before resuming the desired voltage level of 100 volts. FIG. 2B then represents the output from standby power source circuit 33 as DC voltage V5 in which it is seen that in correspondence with the line voltage, the DC voltage V5 also drops below the operational voltage of 5 volts. Once the AC line voltage recovers, the DC voltage V5 then will resume its 5 volt operational level, and this period of time below the operational level is denoted as time period Tr.

Referring back to FIG. 1, a waveform shaping circuit 35 has its input connected to standby power source circuit 33 and generates a reference clock signal suitable for the clock data. In that regard, standby power source circuit 33 provides an AC signal that has the line voltage frequency (50 or 60 cycles) but with a substantially reduced peak to peak voltage. Thus, waveform shaping circuit 35 squares the alternating current signal to a square wave signal that is supplied through input port 14 as the reference clock for counting the current time. This reference clock is counted by central processing unit 11 to form a signal indicating the current hour and minute, which is then supplied through output port 15 to a digital time display 23 that displays the appropriate numerals. In addition to the display of the current time, an elapsed time count could be displayed and a so-called sleep timer could be implemented utilizing these same elements.

A nonvolatile random access memory 24 is connected to micro-computer 10 through input ports 14 and output ports 15 such that when the power source circuit 32 is switched off by operation of one of the keys 21N, the channel data, volume data, and the like that are stored in random access memory 13 will be automatically transferred to nonvolatile random access memory 24 and stored therein even though the relay contacts 22S are open. This is the backup in case the power outage occurs, or the plug 31 is pulled out. In any event, however, according to the present invention the time display data is not transferred to nonvolatile memory 24.

Figure 3:
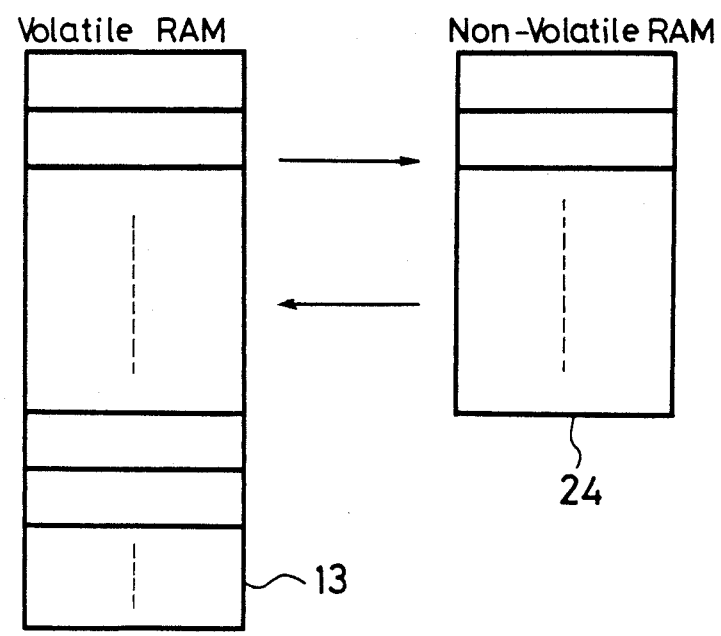
FIG. 3 is a pictorial representation useful in explaining data transfer in the apparatus of FIG. 1.

FIG. 3 is a pictorial representation of the data stored within random access memory 13 being transferred to the nonvolatile random access memory 24 and back again. Because the standby power source circuit 33 is connected to the main power line through plug 31 at a point electrically before the relay contacts 22S even though the television receiver and power source circuit 32 are switched off, micro-computer 10 will remain powered so that the data stored in the RAM 13 is not erased. Nevertheless, in the event that a power failure occurs or plug 31 is pulled out from the outlet, by which operation standby power source circuit 33 is turned off, the drop in voltage V5, as represented in FIG. 3, is detected by reset circuit 34 and central processing unit 11 can be reset thereby, with the data stored in nonvolatile random access memory 24 being subsequently transferred to random access memory 13 in accordance with a predetermined data transfer routine that is contained in read only memory 12. Then, the data stored in non-volatile RAM 24 are effectively transferred to RAM 13 and thence to video output circuit 3, audio output circuit 5, and channel selection control circuit 7. Thus, even though the power to micro-computer 10 is interrupted by reason of a power failure or a disconnection from the AC power lines, and the micro-computer 10 stops operating completely, once the power is recovered the television receiver is placed back into the original operative condition to commence receiving television signals.

Figure 4:
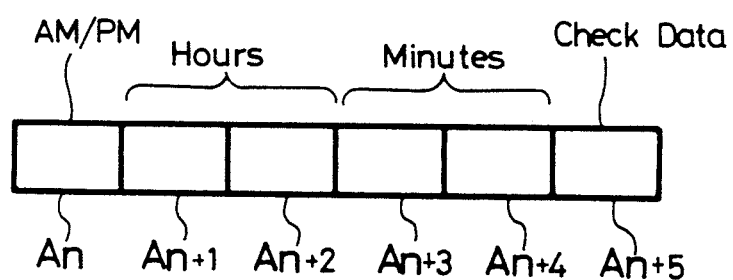
FIG. 4 is a pictorial representation of an arrangement of data used for time display in the apparatus of FIG. 1.

In regard to the display of current time on time display unit 23, addresses $A_n$ to $A_{n+4}$ of random access memory 13 are used as the data area to count the time. This is represented in FIG. 4 in which the addresses to display the hours and minutes are represented and in which address $A_n$ is chosen to represent AM or PM. Each of these addresses, $A_n$ through $A_{n+4}$ are formed as 4-bit addresses in this embodiment. Thus, the data at address $A_{n+4}$ must be refreshed every minute. This is no problem when this information is stored at addresses in RAM 13, however, if there is a power interruption and the time data were to be transferred to nonvolatile random access memory 24 it must still be refreshed every minute. This poses a problem with this nonvolatile memory 24, because it can be accessed only around 100,000 times in its entire lifetime, the clock data cannot be rewritten in the non-volatile random access memory 24 every minute. Thus, the present invention teaches the use of a nonvolatile memory only to store the data for controlling the television receiver but teaches the use of the random access memory already found in the micro-computer to store the time display data. This is only possible because the random access memory has a data holding voltage less than the operational voltage of the micro-computer and a system is provided to check whether the time data in the random access memory is correct and, if so, to use that data for display.

As shown in FIG. 4, in addition to the addresses necessary to provide the digits for the hours and minutes, as well as the AM/PM indicator, a check code is provided with a special bit pattern, for example, "1010" at address $A_{n+5}$.

Figure 5:
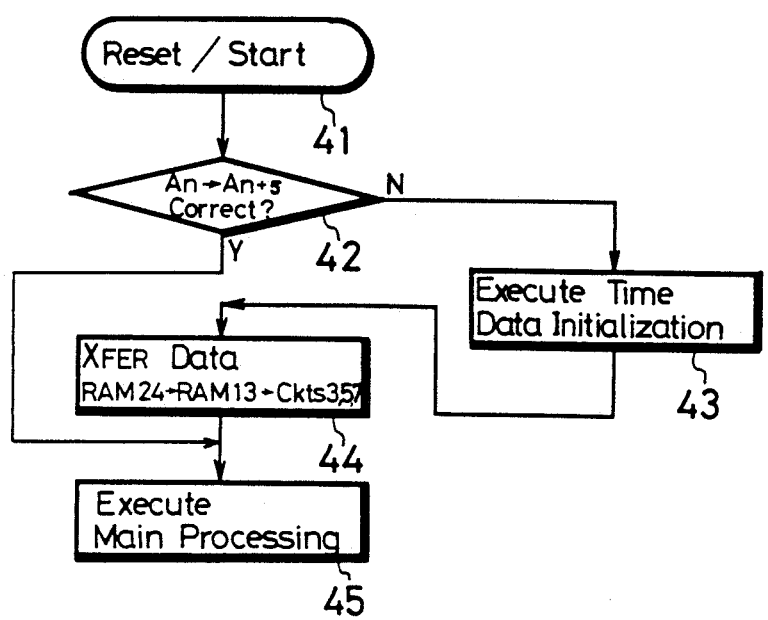
FIG. 5 is a flow chart representing the steps to be taken in the operation of the embodiment of the embodiment of the present invention as shown, for example, in FIG. 1.

The operation of the inventive apparatus will now set forth by means of the operational flow chart of FIG. 5, however, first some details relating to the operation of standby circuit 33 are necessary. More particularly, referring back to FIGS. 2A and 2B, when the main power line voltage drops to essentially zero volts and then recovers to its original voltage level, for example, 100 volts, although the DC voltage V5 as produced by standby power circuit 33 also drops markedly from 5 volts, because of the time constant of standby power circuit 33, the voltage V5 will not drop all the way to zero if the main power line comes back to its original value within a short period of time. In that situation, as represented in FIG. 2B where the voltage V5 drops only to one volt, it has been found that if the random access memory is chosen correctly, then the data stored therein will not be erased and will be retained therein at the normal values when voltage V5 resumes its original value. On the other hand, when voltage V5 does drop all the way to zero, the data stored in random access memory 13 are erased regardless of the choice of data holding voltage.

In view of the above, the operation of the present invention is such that when the power switch of the television receiver is turned off, main data stored in random access memory 13 are automatically transferred to nonvolatile random access memory 24 but the time display are not transferred. Note that if the television receiver is turned back on again, then both the main data and time display data will have been retained correctly in random access memory 13 by means of the standby power source circuit 33 maintaining the power on the micro-computer 10, even though relay contacts 22S are open. The problem, as pointed out above, arises when the plug 31 is pulled from the power socket or if the entire power line goes dead. In the event that voltage is removed from the input to power source circuit 33, the DC voltage V5 will drop, thereby triggering reset circuit 34. The triggering of reset circuit 34 then serves to start a predetermined operational routine that has been stored in read only memory 12. This routine will permit the time display data in random access memory 13 to be used in the event that the power outage exists only instantaneously.

More particularly, the steps in one such routine according to the present invention are shown in FIG. 5, which is started at step 41 at the time that the central processing unit 11 is reset by reset circuit 34 during the period Tr due to the power failure and then the subsequent resumption of the power. Once the routine is started in step 41, it goes to step 42 at which it is checked whether or not the data at addresses $A_n$ to $A_{n+5}$ are correct. This checking of data is carried out by determining whether or not the data at that address falls within a normal range. For example, as represented in FIG. 4, the clock data that indicates the tens digit in the minutes portion is data address $A_{n+3}$ and by determining if the data at this address falls within the range of 0 to 5, then it can be judged whether that data is correct. On the other hand, if the data at address $A_{n+3}$ is outside of these normal values, such as 8, then this data is judged to be incorrect. Similarly, there is a known limit for address $A_{n+1}$ since it can not go above 1. In addition, because the data at $A_{n+5}$ is known to be "1010", if that data is detected then the data is judged to be correct, whereas if that specific code is detected the data is judged to be incorrect. As will be set forth below, if the data is correct it can be used directly from RAM 13 once the power outage ends.

Thus, in the cases described above, because when an instantaneous power failure occurs the DC voltage V5 will rarely drop all the way to zero, if the data stored in random access memory 13 are determined to be retained accurately therein, when the instantaneous power interruption ceases in most cases the data at addresses $A_n$ through $A_{n+5}$ can be regarded as being correct data.

Therefore, if all the data are correct, which will be the situation in most cases of an instantaneous power failure, the inventive routine then advances from step 42 to step 45 in which the main processing executed, as in normal operation. More specifically, because the timing data in RAM 13 are correct then the main data are also correct and such data can be used directly therefrom.

In the case, however, when any one of the data at address $A_n$ through $A_{n+5}$ is erroneous, for example, because of a long power failure, the routine advances from step 42 to step 43 at which initialization of time data is performed. This data is supplied to the time display means 23, whereby some indication, for example, "8888", flashes on and off thereby announcing the occurrence of a power failure. At such point, the processing routine then advances to step 44 where the data contained as backup data in the nonvolatile random access memory 24 are then transferred directly to random access memory 13 for subsequent transfer and supply to video output circuit 3, audio output circuit 5, and the channel selection control circuit 7. Thereafter, the routine moves to step 45 at which the main processing is executed.

According to the present invention, as set forth hereinabove, when an instantaneous power failure occurs, the data relating to the time display is regarded as correct and the time counting operation continues as it is, so that it is not necessary to provide a backup for the power source of the micro-computer 10 by means of a specially provided condenser or capacitor. The accuracy of such time display data is immediately checked, however. In addition, because such backup is realized by a specific routine utilizing a read only memory and central processing unit already employed within a typical micro-computer controlled television receiver, the manufacturing costs of such receiver are maintained at a constant level.

Moreover, by means of a nonvolatile random access memory, even if a power failure occurs and lasts for a relatively long time, no problem is presented because the more important television receiver control data, such as channel selection data, sound volume data, and the like are provided in the backup nonvolatile random access memory. Also, when the power source of the micro-computer is backed up by a backup condenser, the capacitor voltage thereof may be reduced.

Thus, in keeping with the present invention, the apparatus is such that the data holding voltage of the random access memory should be selected to be lower than the operation voltage of the micro-computer. Also, where data is to be refreshed a number of times and can not be accomplished by means of a nonvolatile random access memory the invention provides a routine to follow using existing hardware.

The above description is provided for a single preferred embodiment of the invention, however, it will be apparent that many modifications and variations could be effected by one skilled in the art without departing from the spirit or scope of the novel concepts of the invention, which should be determined only by the appended claims.

What is claimed is:

1. In television receiver of the kind controlled by a micro-computer, apparatus comprising:
   a random access memory having a data holding voltage that is lower than an operation voltage of said micro-computer, said random acces memory being arranged as part of said micro-computer;
   means for supplying a DC voltage to said micro-computer;
   means for determinating when said DC voltage drops lower than said operation voltage of said computer and being operative in response to such determination for performing a resetting operation of said micro-computer; and
   means operative upon completion of said resetting operation for checking data in said random access memory for corrections and for supplying at least said data for main processing in response to a determination that said data are correct.

2. Apparatus according to claim 1, further comprising means for generating clock signals supplied to said micro-computer, and in which said data in said random access memory are timing data.

3. Apparatus according to claim 2, wherein said random access memory further stores main data other than said timing data, further comprising a nonvolatile memory for storing said main data contained in said random access memory other than said timing data.

4. Apparatus according to claim 3, in which said micro-computer includes means operative in response to a determination that said timing data are incorrect for transferring said main data to said random access memory from said nonvolatile memory.

5. Apparatus according to claim 4, further comprising means for displaying time corresponding to said timing data stored in said random access memory.

6. Apparatus according to claim 4, in which said main data include channel selection data.

7. In a system which is controlled by a micro-computer, apparatus comprising:
   a random access memory having a data holding voltage less than an operational voltage of the micro-computer, in which said random access memory is a funtional element of said micro-computer;
   means for supplying a DC voltage to power said micro-computer;
   means for detecting when said DC voltage drops below said operational voltage of said micro-computer and being operative in response to such determination for performing a resetting operation of said micro-computer; and
   means operative upon completion of said resetting operation for determining whether data in said random access memory is correct and for supplying at least said data for main processing in response to a determination that said data in said random access memory are correct.

8. Apparatus according to claim 7, further comprising means for generating clock signals supplied to said micro-computer, and said data in said random access memory are timing data.

9. Apparatus according to claim 8, wherein said random access memory further stores other data different from said timing data, and further comprising a nonvolatile memory for holding said other data different from said timing data and contained in said random access memory.

10. Apparatus according to claim 9, in which said micro-computer includes means operative in response to a determination that said timing data is incorrect for transferring said other data to said random access memory from said nonvolatile memory.

11. Apparatus according to claim 10, further comprising means for displaying time in response to said timing data stored in said rand access memory.

12. Apparatus according to claim 10, in which said other data include television channel selection data.

* * * * *